United States Patent [19]
Byford et al.

[11] Patent Number: 5,166,602
[45] Date of Patent: Nov. 24, 1992

[54] ELASTOMERIC PROBE APPARATUS AND ASSOCIATED METHODS

[75] Inventors: Ivan W. Byford, Dayton; Angelo J. Santopolo, Tomball, both of Tex.

[73] Assignee: Compaq Computer Corporation, Houston, Tex.

[21] Appl. No.: 788,933

[22] Filed: Nov. 7, 1991

[51] Int. Cl.⁵ .................. G01R 1/06; G01R 31/02
[52] U.S. Cl. ..................... 324/158 P; 324/158 F
[58] Field of Search ............ 324/158 F, 158 P, 72.5; 439/66, 68

[56] References Cited

U.S. PATENT DOCUMENTS 4,766,371 8/1988 Moriya .................. 324/158 F

*Primary Examiner*—Ernest F. Karlsen
*Attorney, Agent, or Firm*—Konneker & Bush

[57] ABSTRACT

A specially designed resilient probe device is used in place of the usual series of pogo pins in the electrical testing of a printed circuit board. The device includes a strip-like, nonconductive elastomeric body having upper and lower side edges. Imbedded in the body are a spaced series of vertically elongated metal conductor strips arranged in staggered rows and having upper and lower ends that respectively project slightly beyond the upper and lower body side edges. The body is frictionally retained in a vertical slot formed in a plastic holder, with the upper and lower side edges of the body respectively projecting outwardly beyond the top and bottom ends of the holder. The upper end of the holder is suitably affixed to the underside of a topology circuit board which is laterally moved toward the printed circuit board to slightly compress the elastomeric body between the topology board and printed circuit board to establish electrical contact between aligned series of test contact points thereon via the imbedded conductor members in the elastomeric body. In an alternative embodiment of the device, the elastomeric body has a square cross-section along its vertical length, is releasably secured to the topology board by means of metal clips soldered thereto, and is used to probe a single test contact point on the printed circuit board.

10 Claims, 3 Drawing Sheets

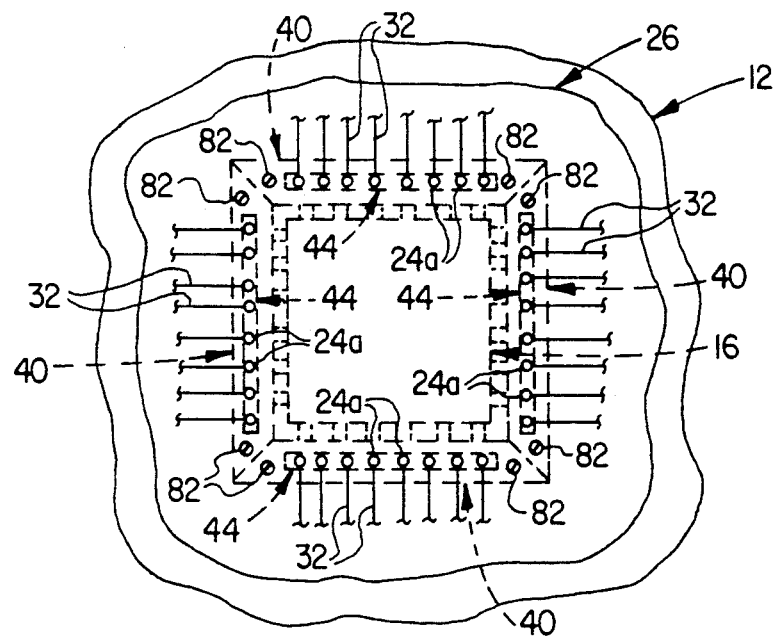
FIG. 8
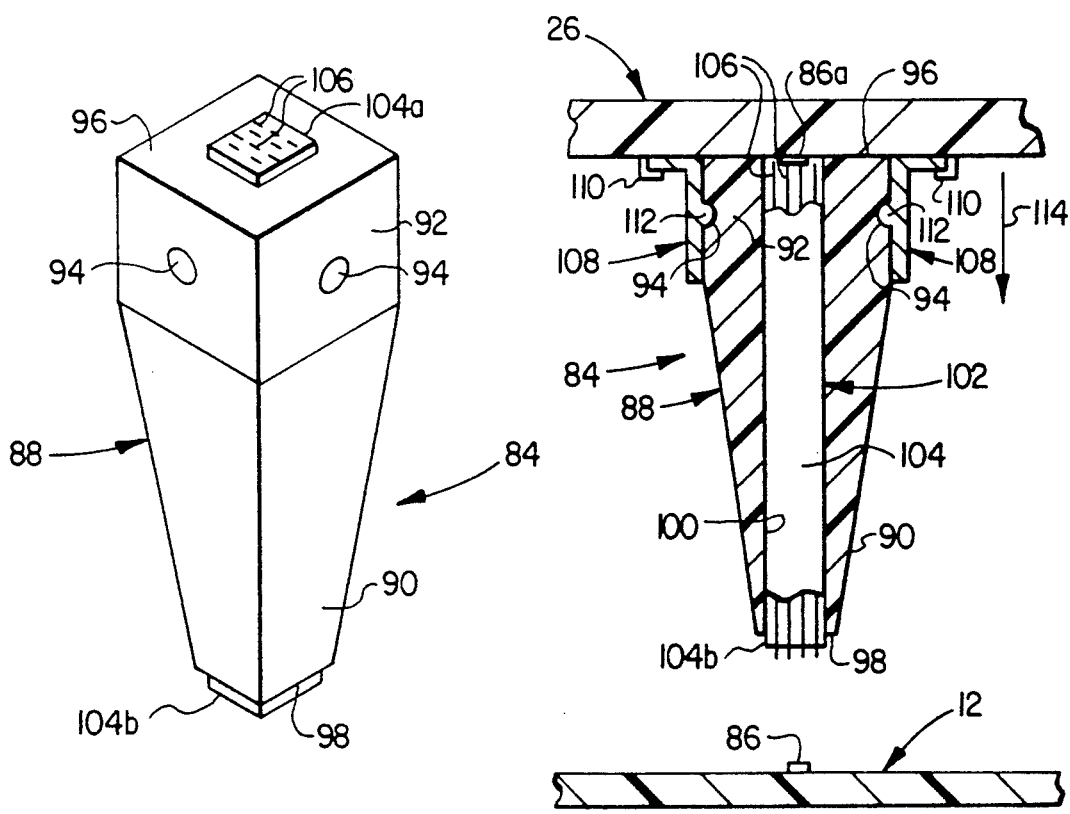
FIG. 9
FIG. 10

ELASTOMERIC PROBE APPARATUS AND ASSOCIATED METHODS

BACKGROUND OF THE INVENTION

1. Field of the Invention

The present invention relates generally to apparatus and methods for electrically testing printed circuit boards and the like, and more particularly relates to probe structures used in such testing.

2. Description of Related Art

The electrical testing of printed circuit boards and the like is conventionally carried out using a spaced series of spring-loaded, electrically conductive metal test pins, typically referred to as "pogo" pins, which project transversely from a supporting probe plate structure. The test pins are spaced on the probe plate in an array having a relative spacing identical to that of a corresponding spaced array of electrically conductive test points on a side surface of the circuit board to be tested. These test points may be surface mounted pads, vias, plated through-holes, or various combinations thereof.

Each of the resilient test pins typically comprises an outer barrel portion in which an inner contact pin portion is telescoped and outwardly biased toward an extended stop position by a cylindrical spring captively retained in the barrel. To operatively support the test pins, an appropriately spaced series of small circular holes are formed through the probe plate member, and inner end portions of the barrels are suitably secured in the plate openings so that the resiliently deflectable contact pin portions project outwardly from the plate in a "bed of nails" configuration.

The inner barrel ends are conductively connected in a suitable manner to test and analysis circuitry used to receive and evaluate electrical signals received from the test contact points on the printed circuit board via the conductive test pin structures. In testing the printed circuit board, the probe plate is positioned in a spaced apart, facing parallel relationship with the circuit board, with the test pins extending toward the circuit board test contact points in an aligned, outwardly spaced relationship therewith. The probe plate is then moved toward the printed circuit board (or vice versa) until the outer test pin ends engage and are longitudinally depressed by their associated test contact points. Electrical test signals are then appropriately transmitted from the test contact points to the test and analysis circuitry via the electrically conductive test pins.

While pogo pins supported in this manner have long been used in the electrical testing of printed circuit boards, they are subject to a variety of well known problems, limitations and disadvantages. For example, the construction of test pin/probe plate assemblies is a time-consuming and expensive task which must be carried out with great care and precision to obtain the requisite degree of alignment accuracy between each test pin and its associated circuit board test contact point.

Additionally, as the test contact point-to-point spacing or "pitch" in modern high density printed circuit boards continues to decrease as board miniaturization evolves, the accurate use of conventional pogo pin test probing becomes increasingly difficult. Moreover, particularly in the case of high density printed circuit boards, conventional pogo pins tend to damage the board's test contact points. For example, as a practical matter it is not feasible to utilize pogo pins where the test contact point pitch is 15 mils or less without damaging the rather delicate test contact points. However, many modern printed circuit boards now utilize a pitch of 6 mils or less.

It can readily be seen from the foregoing that a need exists for an improved printed circuit board test probe structure and associated probe methods that eliminate or minimize the above-mentioned problems, limitations and disadvantages associated with conventional pogo pin probe structures of the general type described above. It is accordingly an object of the present invention to provide such improved apparatus and methods.

SUMMARY OF THE INVENTION

In carrying out principles of the present invention, in accordance with a preferred embodiment thereof, a uniquely configured probe device is provided for use in electrically testing a printed circuit board. The printed circuit board has a plurality of electrical components mounted on a side surface thereof, and transversely projecting a maximum distance outwardly therefrom, and a row of spaced apart test contact points extending along one side of an ASIC device, such as a processor, mounted on the circuit board side surface.

The probe device, which advantageously replaces a large number of conventional resilient metal test pins, comprises an elongated strip of nonconductive elastomeric material having top and bottom side edges slightly longer than the test contact point row and being spaced apart a vertical distance slightly greater than the maximum transverse component projection distance of the printed circuit board.

The elastomeric strip is frictionally retained within a vertical through slot formed in a rigid, nonconductive holder member preferably provided with a downwardly and inwardly tapering lower end portion to facilitate the downward insertion thereof between closely spaced electrical components mounted on the printed circuit board. With the strip operatively inserted in the holder member slot, an upper edge portion of the strip projects slightly upwardly beyond the upper end surface of the holder member, and a lower edge portion of the strip projects slightly downwardly beyond the loser end surface of the holder member.

Imbedded within the interior of the elastomeric strip are a horizontally spaced series of vertically extending electrically conductive strip members that are preferably arranged in a plurality of parallel, staggered rows. Top ends of the conductive strips project slightly upwardly beyond the upper side edge of the elastomeric strip, and bottom ends of the conductive strips project slightly downwardly beyond the bottom side edge of the elastomeric strip. The relative spacing of the conductive strips is such that with the bottom edge of the elastomeric strip operatively aligned with the test contact point row, each test contact point may be downwardly engaged by a plurality of the bottom ends of the conductive strips, without any of such bottom ends bridging between any two of the test contact points.

Means are provided for securing the top surface of the holder member against the underside of a topology circuit board to bring pluralities of the top ends of the conductive members into contact with each of a series of test contact points disposed on the topology board underside, arranged in a row which is a mirror image of the printed circuit board test contact point row, and electrically connected to a suitable test and analysis circuit.

With the probe device secured to the underside of the topology board, and the topology and printed circuit boards in a parallel, spaced apart facing relationship with the test contact points thereon in alignment, a relative inward lateral movement is created between the boards to slightly compress the elastomeric strip therebetween. In this manner each test contact point in the printed circuit board row thereof is electrically connected to its counterpart test contact point in the topology board row thereof by a plurality of the electrically conductive strip members imbedded within the elastomeric strip.

According to a feature of the present invention, an upper portion of the holder is provided with horizontally opposite, beveled ends. This permits the upper end portions of four of the holder members to be engaged in a picture frame-like rectangular orientation, and secured to the underside of the topology board in such orientation, to thereby permit the four lower side edges of the holder-supported elastomeric strips to be simultaneously brought into operative probing engagement with the four test contact point rows extending outwardly along the sides of an ASIC device, such as a processor, mounted on the side surface of the printed circuit board.

According to another feature of the present invention, the elastomeric and rigid holder portions of the probe device are given essentially square cross-sections along their vertical lengths to permit use of the device in redundantly probing a single test contact point on the printed circuit board. In this embodiment of the device, hemispherical depressions are formed in the four exterior sides of an upper end portion of the holder member, and the probe device is removably secured to the underside of the topology board by four resilient clip members soldered to the topology board and having hemispherical projections configured to releasably snap into the holder member depressions to operatively support the probe device on the topology board.

In addition to electrically probing single test contact points, or a row of test contact points extending along a side of an ASIC device, the probe device of the present invention may also be advantageously utilized in the probing of other types of printed circuit board test points including "gold finger" edge connection structures, through-hole connector points, and various types of surface mount technology (SMT) points on printed circuit boards of widely differing sizes and geometric configurations. Importantly, unlike conventional resilient metal test pins traditionally used in these probing applications, the elastomeric probe apparatus of the present invention does not exhibit any appreciable tendency to damage the test contact points being probed. The same test contact points may thus be repeatedly probed, if desired, without being torn or punctured as might well occur if resilient metal pins were used as the electrical probing elements.

BRIEF DESCRIPTION OF THE DRAWINGS

FIG. 8 is a top plan view of a topology board used in the testing of the printed circuit board, and illustrates four of the elastomeric probe devices connected in a rectangular configuration to the underside of the topology board for probing the spaced conductive pads outwardly bordering a representative processor secured to the top side of the printed circuit board;

FIG. 9 is a perspective view of an alternate embodiment of the elastomeric probe device; and FIG. 10 is cross-sectional view through the FIG. 9 probe device illustrating its connection to the underside of a topology board for use in probing a single test contact point on the upper side of a printed circuit board.

DETAILED DESCRIPTION

Figure 1:
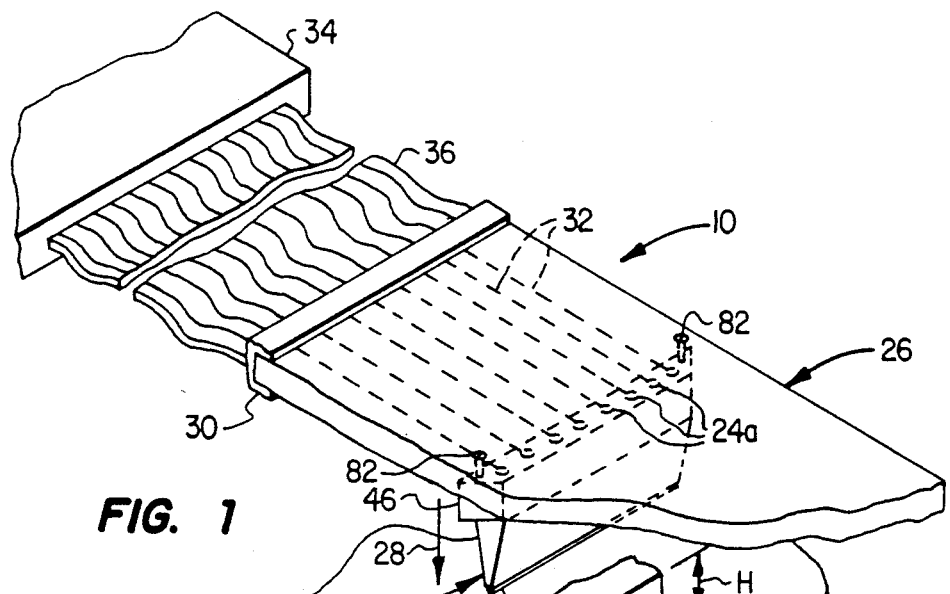
FIGS. 1 and 2 are fragmentary perspective views sequentially illustrating the electrical testing of a portion of a representative printed circuit board using an elastomeric probe device incorporating principles of the present invention.

Referring initially to FIG. 1, in a preferred embodiment thereof the present invention provides specially designed probe apparatus 10 for electrically testing a printed circuit board (PCB) 12, only a small representative portion of which is illustrated. Operatively mounted on the upper side 14 of PCB 12 is an application specific integrated circuit (ASIC) device representatively in the form of a processor 16 having a rectangular configuration. For purposes of discussion it will be assumed that other ASIC devices (not illustrated) are also operatively mounted on board side surface 14, but that the height H of processor 16 represents the maximum transverse projection of any of the devices above board surface 14.

Along each of its four sides, processor 16 is provided with a spaced series of outwardly projecting electrically conductive legs 18 that are soldered, inwardly of a suitable mask structure 20, to the top surfaces of a spaced series of electrically conductive surface mounted pads 22, each of which has an outer end portion 24 that projects outwardly beyond the mask structure 20. As will be seen, these outwardly projecting pad portions 24 serve as electrically conductive test contact points on PCB 12 and will be hereinafter be referred to as such.

The probe apparatus 10 also includes a topology circuit board 26 which is suitably supported above the PCB 12 in a vertically spaced, parallel facing relationship therewith. As used in the printed circuit board inspection art, the term "topology circuit board" means a printed circuit board having a spaced series of electrically conductive contact point portions of its overall circuitry that are arranged in a substantial mirror image of, and are connectable to, electrically conductive contact points on a printed circuit board to be tested. The circuitry of the topology board is typically connected to a test and analysis circuit, so that the topology board serves as a portion of the overall interface structure between the circuit board being tested and the test analysis circuit. Using conventional fixturing structure (not illustrated), the PCB 12 is suitably supported in a fixed position, and the topology board 26 is supported for downward movement toward the PCB 12 as indicated by the arrow 28. Alternatively, the topology board 26 could be fixedly supported, and the PCB 12 supported for selective vertical movement toward and away from the topology board.

Disposed on the underside of the topology board 26 are a spaced series of electrically conductive test contact points 24a arranged in a mirror image orientation relative to the PCB test contact points 24 and positioned in horizontal alignment therewith. The upper test contact points 24a are electrically linked to a conventional edge connector 30, secured as shown to a left side edge of the topology board, by a spaced series of printed circuit traces 32 extending along the bottom side surface of the topology board 26. Via the edge connector 30, the traces 32 are connected to a schematically depicted test and analysis circuit structure through transfer circuitry representatively in the form of a flexible ribbon-type printed circuit member 36.

Figure 2:
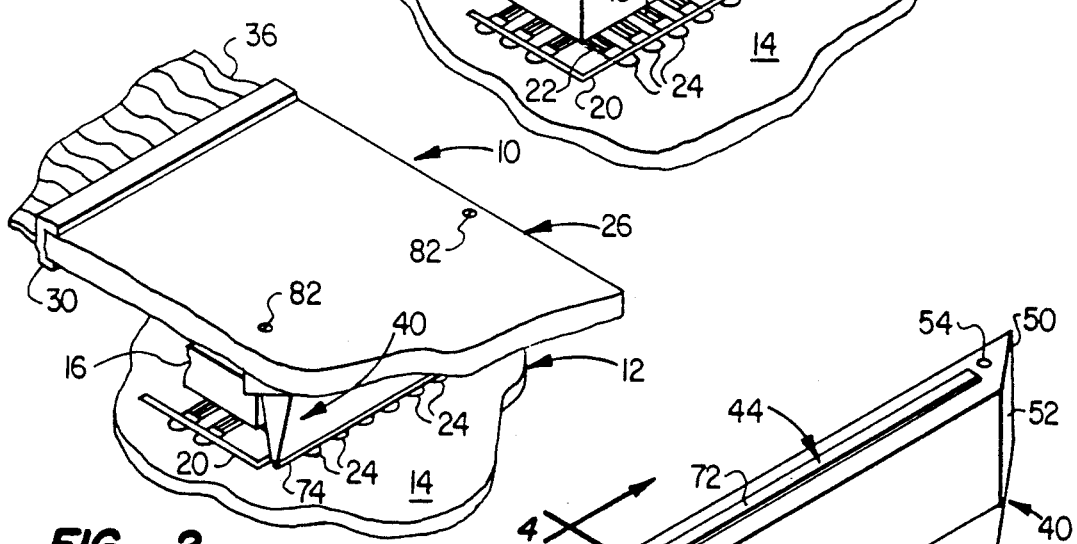
Figure 3:
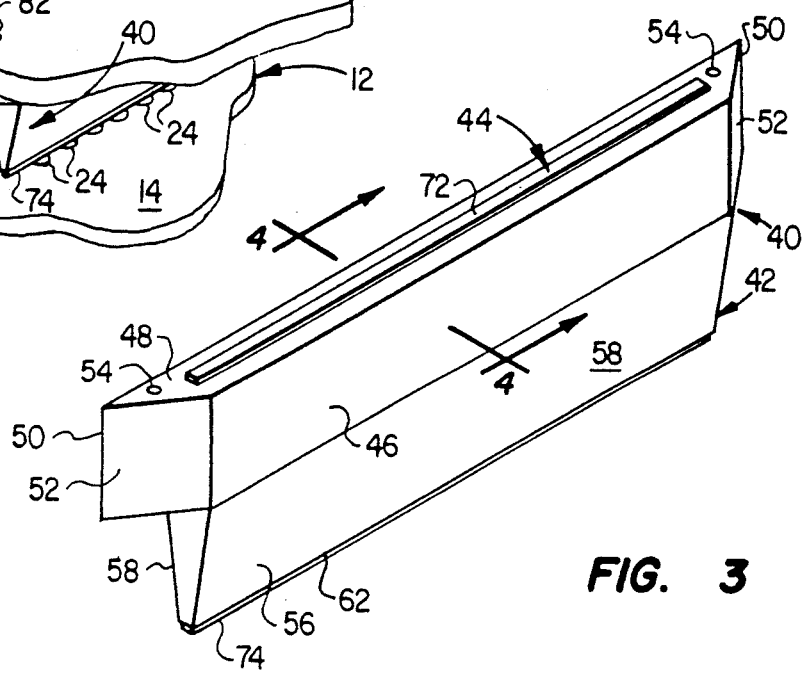
FIG. 3 is an enlarged scale perspective view of the elastomeric probe device.

As will now be described, the present invention provides a specially designed elastomeric probe device 40 that is secured to the underside of the topology board 26, directly beneath its test contact points 24a, and is used to downwardly engage the PCB test contact points 24, and electrically connect each of them to its test contact point 24a counterpart, when the topology board 26 is downwardly moved as illustrated in FIG. 2. Importantly, this electrical connection is achieved without the conventional use of metal pogo pins and accordingly eliminates various problems, limitations and disadvantages commonly associated therewith.

With reference now to FIGS. 3–7, in the illustrated preferred embodiment thereof the elastomeric probe device 40 includes only two simple and relatively inexpensive parts—a rigid molded plastic holder member 42 and a resilient conductor member 44. Holder 46 includes an upper body portion 46 having a trapezoidally shaped cross-section; an essentially planar top side surface 48; and a pair of opposite end portions 50 with beveled sides 50 and vertically extending mounting through-holes 54.

Depending from the underside of upper body portion 46 is a lower body portion 56 having an elongated rectangular cross-section along its vertical length, and a pair of downwardly and inwardly sloping opposite side surfaces 56,58 that terminate at their lower ends at an elongated rectangular bottom end surface 62 of the lower body portion 56. Surface 62 is essentially planar and parallel to the top side surface 48. A slot 64 having an elongated rectangular cross-section is formed within the holder member 42 and opens outwardly through its top and bottom surfaces 48 and 62. For purposes later described, a horizontally spaced series of vertically extending, inwardly projecting ribs 66 are formed on one of the horizontally elongated slot side surface portions 68 within the upper body portion 46.

The resilient conductor member has a resilient body portion 70 which is formed from an electrically nonconductive elastomeric material, preferably a silicon rubber material. Body portion 70 has an elongated rectangular strip configuration with vertically spaced apart, oppositely facing exterior top and bottom side edge surfaces 72 and 74, and opposite vertical exterior side surfaces 76 and 78. The vertical distance X (FIG. 4) between the top and bottom side edges 48 and 62 of the resilient body portion 70 is as least slightly greater than the maximum component projection height H on the PCB 12 (see FIG. 1).

Figure 6:
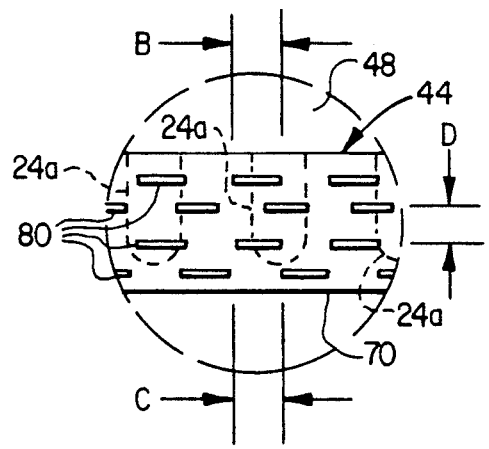
FIG. 6 is an enlargement of the circled area "A" in FIG. 5.
Figure 7:
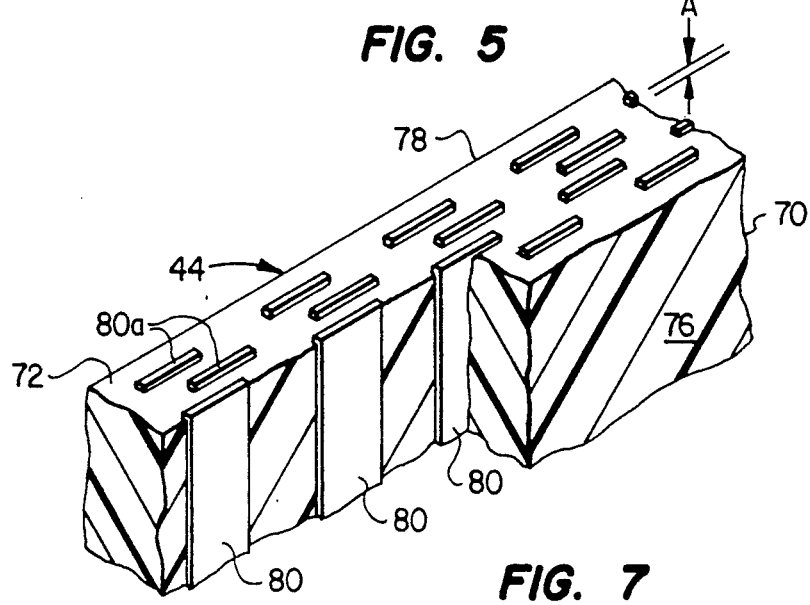
FIG. 7 is an enlarged scale, partially cut away perspective view of a top corner section of an elastomeric conductor portion of the probe device.

Referring now to FIGS. 6 and 7, the resilient conductor member 44 also includes a series of vertically extending metal conductor strips 80 (preferably nickel) permanently imbedded within the interior of the elastomeric body portion 70. As illustrated, the strips 80 longitudinally extend in a vertical direction and, as viewed from the top, are arranged in four laterally spaced apart, staggered rows each parallel to the horizontally elongated side surfaces 76,78 of the elastomeric body portion 70. The strips 70 in each of the four rows thereof are spaced apart from one another, with the widths of the strips extending parallel to the elastomeric body portion side surfaces 76,78.

As best illustrated in FIG. 7, upper end portions 80a of the strips extend upwardly beyond the upper body edge surface 72 a very slight distance A, preferably within the range of from about 0.0001" to about 0.0005", and are preferably gold plated. Lower end portions 80b of the strips 80 extend a similar distance downwardly beyond the bottom side edge surface 74 of the body portion 70, and are also preferably gold plated.

Figure 4:
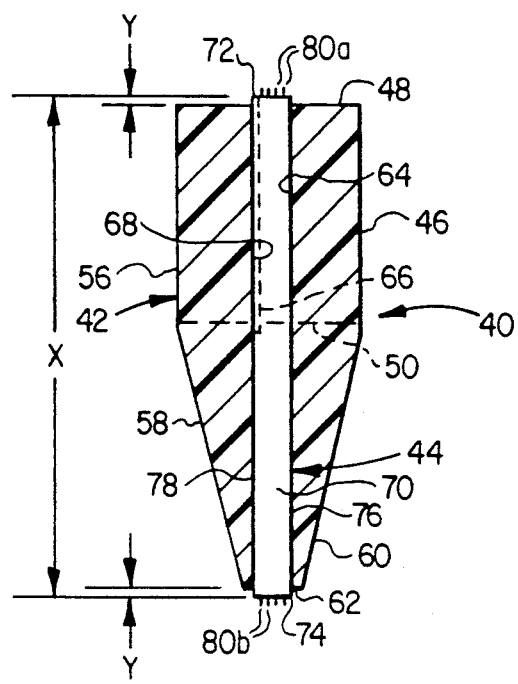
FIG. 4 is an enlarged scale partially elevational cross-sectional view through the elastomeric probe device taken along line 4—4 of FIG. 3.
Figure 5:
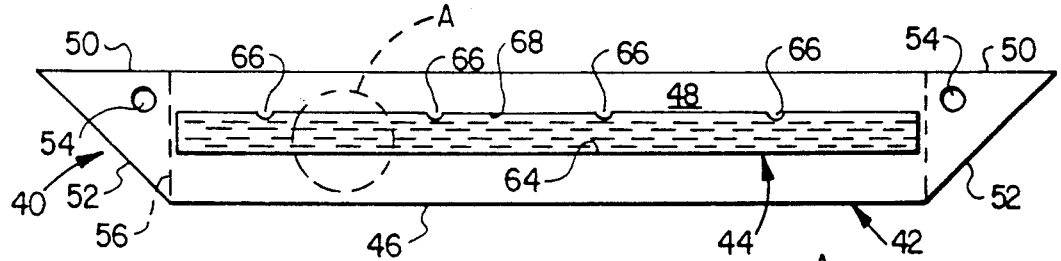
FIG. 5 is an enlarged scale top plan view of the elastomeric probe device as shown in FIG. 3.

The resilient conductor member 44 is operatively installed within the holder member 42 by simply sliding it upwardly into the holder member slot 64 to the position therein illustrated in FIG. 4. The elastomeric body portion 70 is cross-sectionally configured so that it is snugly received within slot 64, and the ribs 68 frictionally engage the inserted body portion 70, as best illustrated in FIGS. 4 and 5, to retain it in the slot.

Referring now to FIG. 4, the elastomeric body portion 70 is vertically dimensioned such that the distance X between its upper and lower side edge surfaces 72 and 74 is just slightly greater than the vertical distance between the top and bottom surfaces 48 and 62 of the holder member 42. Accordingly, when the resilient conductor member 44 is operatively inserted within the holder member 42 as shown in FIG. 4, the end surfaces 72 and 74, respectively, of the elastomeric body portion 70 project vertically outwardly a slight distance Y beyond the top and bottom surfaces 48 and 62 of the holder member 42. Distance Y is representatively about 15 mils.

Referring again to FIG. 1, the top surface 48 of the holder member 42 is firmly secured against the underside of the topology board 26, with the four rows of upper conductor strip end portions 80a parallel to and directly beneath the row of upper test contact points 24a, by means of two screws 82 extended downwardly through corresponding circular openings in the topology board and threaded into the openings 54 (FIG. 5) in the holder member 42.

The topology board 26 is then moved downwardly, as illustrated in FIG. 2, until the elastomeric body portion 70 is slightly compressed between the boards 12 and 26. This causes various ones of the upper and lower conductive strip end portions 80a,80b to respectively engage the vertically opposed test contact points 24a and 24 and complete the operative electrical connection between the PCB test contact points 24 and the test and analysis circuit structure 34.

The use of the probe device 40 instead of the usual array of pogo pins provides a variety of advantages. For example, the rigidly supported resilient conductor member 44, by virtue of the number and spacing of the conductor strips 80 imbedded within its elastomeric body portion 70, replaces a large number of closely spaced pogo pins. Additionally, the conductor strips 80 advantageously provide for redundant contact with relatively large test contact points having relatively large pitch spacing, while at the same time providing the opportunity to accurately probe very small test contact points having very fine pitch spacing.

To illustrate this latter advantage, let it be assumed that the pitch of each spaced series of test contact points 24,24a in FIG. 1 is 6 mils—i.e., a point-to-point spacing of 0.006". With reference to FIG. 6, as viewed from above the representative size and spacing of the metal conductor strips 80 are as follows. The width B of the strips 80 is 5 mils; the spacing C between adjacent strips in each of the four rows thereof is 5 mils; the spacing D between rows is 4 mils; and the thickness of each strip is 0.0005".

Three of the upper test contact points 24a are shown in dotted lines above the upper ends of the strips 80 in FIG. 6. It can be seen that even with their very small spacing pitch of 6 mils, each of the upper test contact points 24a (as well as each of the lower test contact points 24) is engaged by a plurality of the strips 80, but none of the strips "bridges" between any adjacent pair of test contact points. Accordingly, there is both contact redundancy and the ability to handle much smaller spacing pitches than conventional pogo pins. The illustrated spacing and size of the strips 80 are, of course, merely representative, and can be altered to suit the particular test probe application.

The beveled end surfaces 52 on the holder upper body portion 46 conveniently permits the upper body portions 46 of four of the probe devices 49 to be secured, picture frame-like, to the underside of the topology board 26 as indicated in phantom in FIG. 8 (using screws 82). This arrangement of the four probe devices conveniently allows their resilient conductor members 44 to operatively interconnect the four rows of lower test contact points 24 (extending along the four sides of the processor 16) with the illustrated four rows of upper test contact points 24a disposed on the underside of the topology board 26. The upper test contact points 24a are connected by traces 32 to the edge connector 30 (FIG. 1).

Turning now to FIGS. 9 and 10, an alternate embodiment 84 of the probe device 40 may be conveniently used to probe a single test contact point 86 on the upper side of PCB 12 and conductively connect it with a corresponding test contact point 86a on the underside of the topology board 26.

The modified probe device 84 includes a vertically elongated rigid holder member 88 having a square cross-section along its length; a downwardly and inwardly tapered lower portion 90; a nontapered upper end portion 92 with hemispherical indentations 94 formed in the four outer side surfaces thereof; a top end surface 96; a bottom end surface 98; and a rectangularly cross-sectioned slot 100 extending vertically through the holder and opening outwardly through its top and bottom end surfaces 96 and 98.

Received and frictionally retained within slot 100 is a vertically elongated, square cross-sectioned resilient conductor member 102 having a silicone rubber body portion 104. Body portion 104 is just slightly longer than slot 100 so that when it is operatively installed therein, upper and lower end portions 104a and 104b of the body respectively project outwardly beyond the top and bottom end surfaces 96,98 of the holder 88 as best illustrated in FIG. 9.

A spaced series of vertically extending electrically conductive metal strip members 106, arranged in staggered rows, are imbedded within elastomeric body 104, with small upper and lower end portions of strip members 106 respectively projecting outwardly beyond the upper and lower ends of the body 104 as previously described in conjunction with the probe device 40.

The upper end of the probe device 84 is removably secured to the underside of the topology board 26 by means of four generally L-shaped metal clip members 108 arranged in a rectangular array. Each of the clip members 108 has an upper leg that is soldered to the underside of the board 26, by means of a solder pocket 110, and a depending leg having a hemispherical projection 112 on its inner side surface. The rectangularly arrayed clip members 108 are centered about the upper test contact point 86a.

The probe device 84 is removably secured to the underside of the topology board 26 by simply pressing the upper holder portion 92 upwardly against the board 26 (FIG. 10), within the four clip members 108, until the clip projections 112 releasably snap into the corresponding holder member indentations 94. This causes the upper ends of a plurality of the conductive metal strip members 106 to operatively contact the upper test contact point 86a. With the probe device installed in this manner on the topology board 26, board 26 may be lowered toward the PCB 12, as indicated by the arrow 114 in FIG. 10, to slightly compress the elastomeric body portion 104 between the boards 12,26 and establish a redundant conductive connection between the test contact points 86 and 86a via a plurality of the conductive metal strip members 106.

In each of the probe device embodiments 40,84 described above, the rigid lateral encapsulation and support of their elastomeric body portions by the specially configured, tapered holders permits these flexible conductor structures to have vertical lengths sufficient to probe downwardly past upwardly projecting components operatively mounted on the printed circuit board being tested, the lower end tapering of the holders permitting them to fit within even relatively small clearance spaces between two such components. The probe devices are of a simple, and relatively inexpensive construction, and are very simple to install and use, yet compactly provide a means for desirably replacing a multiplicity of conventional resilient metal test pin structures.

The foregoing detailed description is to be clearly understood as being given by way of illustration and example only, the spirit and scope of the present invention being limited solely by the appended claims.

What is claimed is:

1. A method of testing a printed circuit board having at least one electrically conductive test contact point disposed on a side surface thereof together with a plurality of electrical components operatively connected to and projecting outwardly a substantial distance transversely from said side surface, said method comprising the steps of:

providing a topology circuit board having disposed on a side surface thereof at least one electrically conductive test contact point conductively connectable to a test and analysis circuit;

providing a probe member comprising:

a nonconductive elastomeric body having parallel first and second oppositely facing exterior surfaces spaced apart in a first direction a first distance at least slightly greater than the maximum component transverse projection distance on said printed circuit board, and a spaced series of electrically conductive strip members fixedly imbedded in said elastomeric body and longitudinally extending parallel to said first direction, said strip members having first ends projecting slightly outwardly beyond said first surface of said elastomeric body, and second ends projecting slightly outwardly beyond said second surface of said elastomeric body;

providing a holder member formed from a rigid, nonconductive material and having:

first and second oppositely facing exterior surfaces spaced apart a second distance slightly less than said first distance, and an interior slot opening outwardly through said first and second surfaces of said holder member and configured to snugly receive and firmly support said elastomeric body in an operatively inserted orientation within said interior slot in which said first surface of said elastomeric body is disposed slightly outwardly beyond said first surface of said holder member, and said second surface of said elastomeric body is disposed slightly outwardly beyond said second surface of said holder member;

operatively inserting said elastomeric body in said interior holder member slot so that a major portion of said elastomeric body between said first and second surfaces thereof is encapsulated and rigidly supported by said holder member;

securing said first surface of said holder member against said side surface of said topology circuit board, with a plurality of said first ends of said conductive strip members being in a facing relationship with each of said at least one test contact point on said topology circuit board, in a manner such that said probe member projects transversely outwardly from said topology circuit board;

positioning said topology circuit board and said printed circuit board in a spaced apart, facing parallel relationship in which each test contact point on said topology circuit board is aligned with its counterpart test contact point on said printed circuit board, and in which said second surface of said elastomeric body faces and is spaced outwardly apart from said at least one test contact point with a plurality of said second ends of said conductive strip members being aligned with each of said at least one test contact point on said printed circuit board; and conductive interconnecting each of said at least one test contact point on the printed circuit board with each of said at least one test contact point on the topology board with a plurality of said electrically conductive strip members by creating relative inwardly lateral movement between the aligned topology circuit board and printed circuit board to compress said elastomeric body between said side surfaces of said topology circuit board and said printed circuit board, whereby said holder member acts as a stop to prevent contact between said topology circuit board and said electrical components.

2. The method of claim 1 further comprising the step of:

inwardly tapering an end portion of said holder member adjacent said second surface thereof to facilitate the passage of said second surface thereof between two adjacent, outwardly projecting components on the printed circuit board.

3. The method of claim 1 further comprising the step of:

arranging said electrically conductive strip members in a plurality of parallel, staggered rows within said elastomeric body.

4. The method of claim 1 further comprising the step of:

providing rib means disposed on an interior surface of said slot and operative to facilitate the frictional retention of said elastomeric body within said slot.

5. The method of claim 1 wherein said securing step is performed using threaded fasteners extending through the topology board and threaded into said holder member.

6. The method of claim 1 wherein said securing step includes the steps of:

forming a spaced plurality of exterior surface indentations in said holder member adjacent said first surface thereof, securing a spaced plurality of resilient clip members to the topology board in an array configured to receive the portion of the holder member having said exterior surface indentations thereon, forming projections on said resilient clip members configured to be complementarily received in said exterior surface indentations, and positioning said portion of the holder member within the clip member array in a manner causing said projections to releasably snap into said indentations.

7. The method of claim 6 wherein:

said resilient clip members are formed from metal, and said step of securing the clip members to the topology board is performed by soldering the clip members thereto.

8. The method of claim 1 further comprising the step of:

providing said elastomeric body with an elongated rectangular cross-section along the distance thereof between its first and second exterior surfaces.

9. The method of claim 1 further comprising the step of:

providing said elastomeric body with an essentially square cross-section along the distance thereof between its first and second exterior surfaces.

10. A method of electrically probing four rectangularly arrayed rows of spaced apart test contact points on a side surface of a printed circuit board, said method comprising the steps of:

providing a topology circuit board having disposed on a side surface thereof four rectangularly arrayed rows of spaced apart test contact points alignable with said test contact points on the printed circuit board;

providing four probe members, each including:

a nonconductive elastomeric body having a strip-like configuration with parallel first and second oppositely facing exterior side edge surfaces, a spaced series of electrically conductive strip members fixedly imbedded in said elastomeric body and longitudinally extending between said first and second exterior side edge surfaces thereof, said strip members having first ends projecting slightly outwardly beyond said first side edge surface of said elastomeric body, and second ends projecting slightly outwardly beyond said first side edge surface of said elastomeric body, and second ends projecting slightly outwardly beyond said second side edge surface of said elastomeric body;

providing four holder members each formed from a rigid, nonconductive material and having:

first and second oppositely facing exterior surfaces spaced apart a distance slightly less than the distance between said first and second side edge surfaces of said elastomeric body, said first holder member surface being disposed on a generally trapezoidally shaped mounting portion of the holder member having a pair of opposite beveled end surfaces, and an interior slot having an elongated rectangular cross-section and opening outwardly through said first and second surfaces of the holder member and configured to snugly receive and firmly support one of the elastomeric bodies in an operatively inserted orientation within the slot in which the first side edge surface of the inserted elastomeric body is disposed slightly outwardly beyond the first surface of the holder member, and the second side edge surface of the inserted elastomeric body is disposed slightly outwardly beyond the second surface of the holder member;

operatively inserting the elastomeric bodies in the holder member slots so that major portions of said elastomeric bodies between said first and second side edge surfaces thereof are encapsulated and rigidly supported by their associated holder members;

aligning the first surfaces of the inserted elastomeric bodies with the four rows of test contact points on the topology circuit board, in a manner such that pluralities of said first ends of the electrically conductive strip members underlie each of the topology circuit board test contact points, by securing the first surfaces of the holder members against said side surface of the topology circuit board with the beveled end surfaces of the holder member mounting portions engaging one another to position the mounting portions in a picture frame-like rectangular array;

positioning said topology circuit board and said printed circuit board in a spaced apart, facing parallel relationship in which each test contact point on said topology circuit board is aligned with its counterpart test contact point on said printed circuit board, and in which the second surfaces of the elastomeric bodies face and are spaced outwardly apart from the rows of test contact points on the printed circuit board, with pluralities of the second ends of the electrically conductive strip members being aligned with each of the printed circuit board test contact points; and conductively interconnecting each of the printed circuit board test contact points with its counterpart test contact point on the topology circuit board, through a plurality of said electrically conductive strip members, by creating relating inward lateral movement between the aligned topology circuit board and printed circuit board to compress the elastomeric bodies between said side surfaces of said topology circuit board and said printed circuit board.

* * * * *